United States Patent [19]

Kubo et al.

[11] Patent Number: 5,177,581
[45] Date of Patent: Jan. 5, 1993

[54] LIGHT RECEIVING PN JUNCTION SEMICONDUCTOR DEVICE WITH SILICON NITRIDE FILM

[75] Inventors: Masaru Kubo; Takuya Itou, both of Nara, Japan

[73] Assignee: Sharp Kabushiki Kaisha, Osaka, Japan

[21] Appl. No.: 789,848

[22] Filed: Nov. 12, 1991

[30] Foreign Application Priority Data

Nov. 14, 1990 [JP] Japan .................. 2-309140

[51] Int. Cl.⁵ ........................................ H01L 27/14
[52] U.S. Cl. .................... 257/437; 257/461; 257/446; 257/443
[58] Field of Search .............. 357/30 P, 30 H, 30 L, 357/32, 54, 52, 52 C, 54 N, 48, 50, 24 LR

[56] References Cited

U.S. PATENT DOCUMENTS

| | | | |
|---|---|---|---|
| 4,660,065 | 4/1987 | Carvajal et al. | 357/52 X |
| 4,774,557 | 9/1988 | Kosonocky | 357/24 LR |
| 4,831,430 | 5/1989 | Umeji | 357/30 P X |

FOREIGN PATENT DOCUMENTS 60-97681  5/1985  Japan .................. 357/30 P
61-16580  1/1986  Japan .................. 357/30 P

OTHER PUBLICATIONS

Noguchi et al., "Preamplifier IC with Photodetectors for Optical Pickup", *The Institute of Electronics and Communication*.
*Engineers of Japan*, vol. 86, No. 241, pp. 75-88.

*Primary Examiner*—William Mintel
*Attorney, Agent, or Firm*—Nixon & Vanderhye

[57] ABSTRACT

A light receiving semiconductor device includes a semiconductor substrate of a first conductivity type, a semiconductor layer of a second conductivity type formed on the substrate, isolation regions of the first conductivity type for separating the second conductivity type semiconductor layer into a plurality of islands, at least one of the second conductivity type islands and the first conductivity type substrate constituting a light receiving element, an anti-reflection film covering at least the entire surface of the island of the light receiving element, and a first conductivity type layer formed between the anti-reflection film and the second conductivity type island and extending to the first conductivity type isolation region surrounding the island of the light receiving element.

5 Claims, 2 Drawing Sheets

LIGHT RECEIVING PN JUNCTION SEMICONDUCTOR DEVICE WITH SILICON NITRIDE FILM

BACKGROUND OF THE INVENTION

1. Field of the Invention

The present invention relates generally to light receiving semiconductor devices and, more particularly, to anti-reflection structures for improving optical sensitivity of the light receiving semiconductor devices.

2. Description of the Background Art

Light receiving semiconductor devices are widely used as photosensors, photocouplers and so on, and, in many cases, are integrated in a common semiconductor chip on which a related signal processing circuit is also formed.

FIG. 1 is a schematic cross-sectional view showing one example of a conventional light receiving semiconductor device. For example, an N-type epitaxial layer 2 is formed on a P-type semiconductor substrate 1 and P-type isolation regions 3 are formed, reaching P-type semiconductor substrate 1 from the surface of N-type epitaxial layer 2 so as to separate N-type epitaxial layer 2 into a plurality of islands. One N-type epitaxial region 2a surrounded by P-type isolation region 3 and P-type substrate 1 constitute a light receiving element PD1 such as a photodiode, and semiconductor elements for a related circuit are formed in other N-type epitaxial regions surrounded by P-type isolation regions 3. While the surface of epitaxial layer 2 is covered with an oxide film 4 such as SiO$_2$ which serves as an insulation film, oxide film 4 is eliminated on the surface in N-type epitaxial region 2a to be a cathode of light receiving element PD1.

The area where oxide film 4 on cathode 2a of light receiving element PD1 is eliminated is covered with a nitride film 5 such as Si$_3$N$_4$ serving as an anti-reflection film. Oxide film 4, however, extends over the boundary of P-type isolation region 3 and into cathode region 2a by a prescribed small distance. That is, the peripheral portion of cathode region 2a is not covered with an anti-reflection film 5 but with insulation film 4.

In this regard, although anti-reflection film 5 of Si$_3$N$_4$ on epitaxial layer 2 has a small reflectance of about 5%, insulation film 4 of SiO$_2$ has a considerably large reflectance of about 15%.

Accordingly, in the structure of the conventional light receiving element PD1, light reflection cannot be efficiently reduced in the peripheral portion of N-type epitaxial region 2a which is not directly covered with anti-reflection film 5, reducing optical sensitivity of light receiving element PD1. In particular, such a decrease in the optical sensitivity causes a problem in a split photodiode used in an optical pick-up and so on. Construction of a split photodiode having six sub-regions is shown, for example, in N. Noguchi et al, "Preamplifier IC with Photodetectors for Optical Pickup" in *The Institute of Electronics and Communication Engineers of Japan*, Vol. 86, No. 241, pp. 75–88 published on Nov. 25, 1986.

FIG. 2 illustrates one example of a light receiving semiconductor device used in such an optical pick-up. Although two photodiode regions of a split photodiode device appear in this sectional view, the split photodiode device may include any number of photodiode regions. Though the semiconductor device of FIG. 2 is similar to that in FIG. 1, it includes photodiodes PD2 and PD3 formed in two adjacent islands 2b and 2c, respectively. Each of photodiodes PD2 and PD3 has the same structure as that of photodiode PD1 in FIG. 1.

FIG. 3 is a graph showing the optical sensitivity characteristic of the light receiving semiconductor device of FIG. 2 wherein the ordinates represent optical sensitivity and the abscissas represents positions on the semiconductor chip. The curved line PD2 represents the optical sensitivity characteristic of photodiode PD2 on the left side in FIG. 2 and the curved line PD3 represents the characteristic of photodiode PD3 on the right side. As seen from this graph, since the anti-reflection in the peripheral portions of photodiodes PD2 and PD3 is insufficient, the optical sensitivity is lowered in the vicinity of the boundary of didoes PD2 and PD3 as indicated by the dotted line (PD2+PD3).

In order to improve the optical sensitivity of the photodiode according to the prior art as stated above, it is desirable that at least the entire surface of the cathode region of the photodiode should be covered with a Si$_3$N$_4$ film as an anti-reflection film. In a case where the PN junction boundary between the N-type cathode region and the P$^-$-type isolation region is covered with the anti-reflection film of Si$_3$N$_4$, however, surface leakage current crossing the PN junction boundary becomes large compared with the case where it is covered with an insulation film of SiO$_2$. This is because the interfacial energy levels at the interface between the Si$_3$N$_4$ film and the semiconductor layer are much more than those at the interface between the SiO$_2$ film and the semiconductor layer.

SUMMARY OF THE INVENTION

In view of the background art as stated above, an object of the present invention is to provide a light receiving semiconductor device having the optical sensitivity improved while preventing an increase in the surface leakage current at the edge of the semiconductor junction interface.

A light receiving semiconductor device in accordance with the present invention includes a semiconductor substrate of a first conductivity type, a semiconductor layer of a second conductivity type formed on the substrate, isolation regions for separating the second conductivity type semiconductor layer into a plurality of islands, at least one of the second conductivity type islands and the first conductivity type substrate constituting a light receiving element, an anti-reflection film for covering at least the entire surface of the island of the light receiving element, and a first conductivity type layer formed between the anti-reflection film and the second conductivity type island and extending to a first conductivity type isolation region surrounding the island of the light receiving element.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 4:
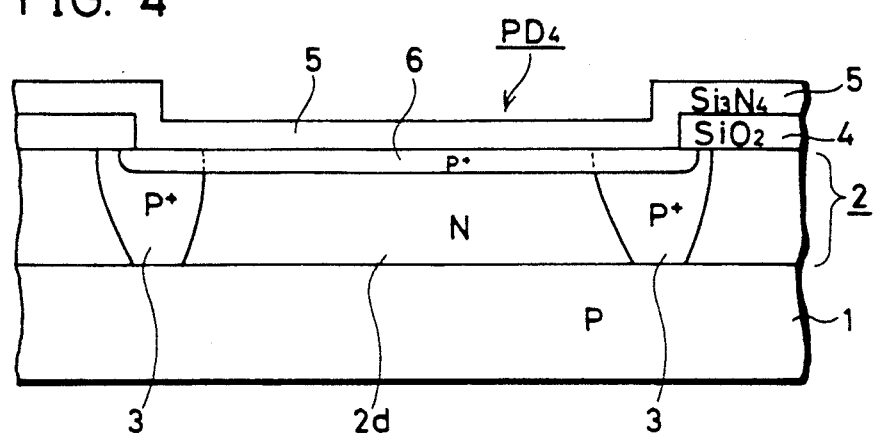
FIG. 4 is a cross-sectional view showing a light receiving semiconductor device in accordance with one embodiment of the present invention.

Referring to FIG. 4, there is illustrated a light receiving semiconductor device in accordance with one embodiment of the present invention. An N-type epitaxial layer 2 is formed on a P-type semiconductor substrate 1 and P-type isolation regions 3 are formed, reaching P-type semiconductor substrate from the surface of N-type epitaxial layer 2 so as to separate N-type epitaxial layer 2 into a plurality of islands. One N-type island 2d surrounded by P-type isolation region 3 and P-type substrate 1 constitute a photodiode PD4 including the PN junction therebetween. Semiconductor elements for a related circuit are formed in other islands surrounded by P-type isolation regions 3.

A thin P⁻ layer 6 is formed on the entire surface of island 2d of photodiode PD4 and P⁻ layer 6 extends to P⁻ isolation region 3 surrounding photodiode PD4.

Epitaxial layer 2 is covered with an oxide film 4 such as $SiO_2$ serving as an insulation film except for the entire surface of island 2d of photodiode PD4. At least the entire surface of island 2d of photodiode PD4 is covered with a $Si_3N_4$ film serving as an anti-reflection film.

In photodiode PD4 shown in FIG. 4, since the peripheral portions of island 2d are not covered with insulation film 4 of $SiO_2$ but with anti-reflection film 5 of $Si_3N_4$, the optical sensitivity of photodiode PD4 is improved. Furthermore, since the interface between anti-reflection film 5 and epitaxial layer 2 does not cross the PN junction interface, anti-reflection film 5 does not increase the leakage current in the PN junction interface.

Figure 5:
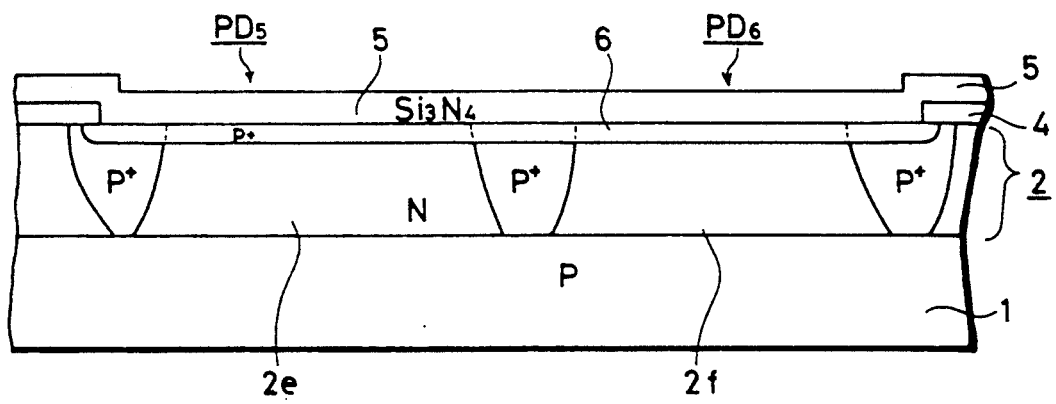
FIG. 5 is a cross-sectional view showing a light receiving semiconductor device in accordance with another embodiment of the present invention.

Referring to FIG. 5, there is illustrated a light receiving semiconductor device used in an optical pick-up in accordance with another embodiment of the present invention. Though the device of FIG. 5 is similar to that of FIG. 4, it includes photodiodes PD5 and PD6 formed in two adjacent islands 2e and 2f, respectively. Each of these photodiodes PD5 and PD6 has the same structure as that of photodiode PD4 in FIG. 4.

Figure 1:
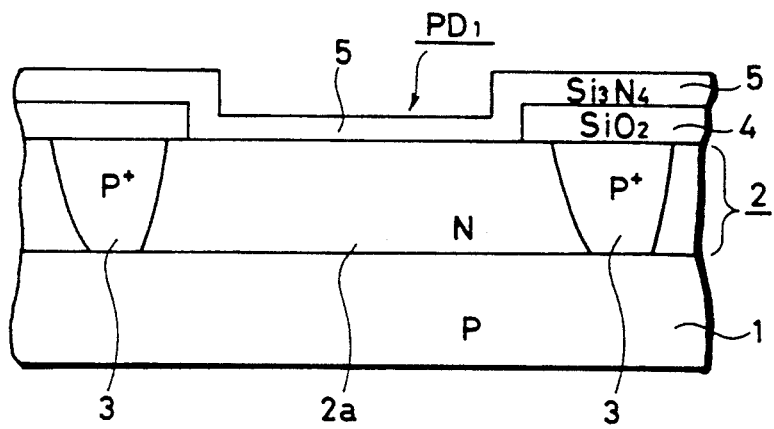
FIG. 1 is a cross-sectional view showing one example of a light receiving semiconductor device in accordance with the prior art.
Figure 2:
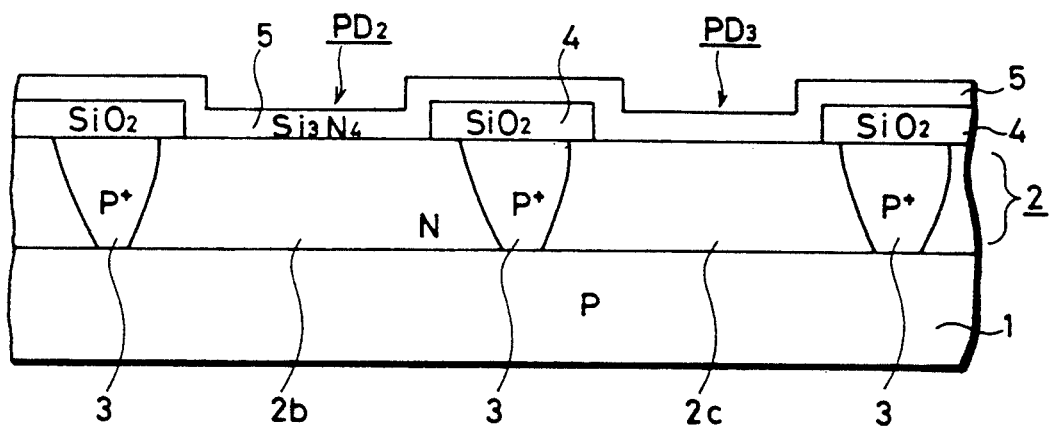
FIG. 2 is a cross-sectional view showing another example of the light receiving semiconductor device in accordance with the prior art.
Figure 3:
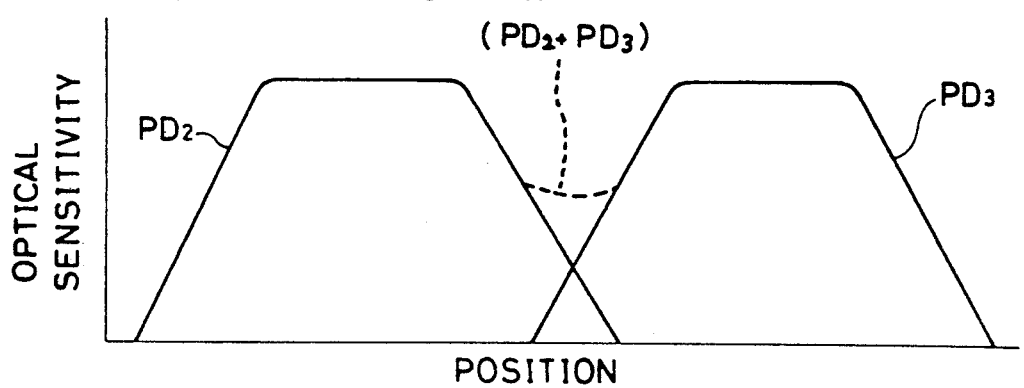
FIG. 3 is a graph showing the optical sensitivity in the light receiving semiconductor device of FIG. 2.
Figure 6:
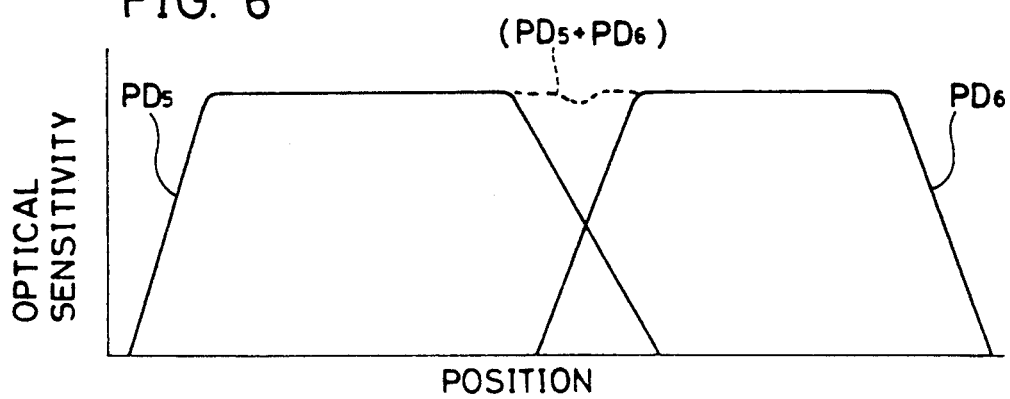
FIG. 6 is a graph showing the optical sensitivity in the light receiving semiconductor device of FIG. 5.

Referring to the graph of FIG. 6, there is shown the optical sensitivity characteristic of the light receiving semiconductor device in FIG. 5. In this graph, the curved line PD5 represents the optical sensitivity characteristic of photodiode PD5 on the left side in FIG. 5 and the curved line PD6 represents the characteristic of photodiode PD6 on the right side. As seen from FIG. 6, in comparison with FIG. 3, anti-reflection is improved in the peripheral portion of each of photodiodes PD5 and PD6, and the optical sensitivity in the vicinity of the boundary between diodes PD5 and PD6 is improved as indicated by the dotted line (PD5+PD6). Additionally, the optical sensitivity is improved without increasing the leakage current crossing the PN junction interface in the light receiving semiconductor device of FIG. 5.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A light receiving semiconductor device, comprising:

a semiconductor substrate of a first conductivity type;

a semiconductor layer of a second conductivity type formed on said first conductivity type substrate;

isolation regions of the first conductivity type for separating said second conductivity type semiconductor layer into a plurality of islands, at least one of said second conductivity type islands and said first conductivity type substrate forming a p-n junction and constituting a light responsive element;

an anti-reflection $Si_3N_4$ film formed to cover at least the entire surface of said island of said light responsive element; and a first conductivity type layer formed between and in direct contact with said anti-reflection film and said second conductivity type island and extending to the first conductivity type isolation region surrounding said island of said light responsive element.

2. The device according to claim 1, further comprising a plurality of light responsive elements formed in said plurality of islands adjacent to each other.

3. The device according to claim 1 wherein said first conductivity type layer extends to and over a portion of said isolation region surrounding said island so that said anti-reflection film is not in contact with the junction between said island and said isolation region.

4. The device according to claim 3 wherein said anti-reflection film covers the surface of the device and said first conductivity type layer extends over a portion of said isolation region so as to prevent an increase in p-n junction leakage when said anti-reflection film is formed to cover the surface of the device.

5. The device according to claim 1 further including an insulating film extending over said isolation region surrounding said island so that said anti-reflection film is not in contact with the junction between said island and said isolation region.

* * * * *